United States Patent
Song et al.

(10) Patent No.: US 7,136,370 B2
(45) Date of Patent: Nov. 14, 2006

(54) MULTICARRIER DS/CDMA SYSTEM USING A TURBO CODE WITH NONUNIFORM REPETITION CODING

(75) Inventors: Iick Ho Song, Daejon (KR); Yun Hee Kim, Daejon (KR); Hyoung Moon Kwon, Seoul (KR)

(73) Assignee: Korea Advanced Institute of Science and Technology, Daejon (KR)

( * ) Notice: Subject to any disclaimer, the term of this patent is extended or adjusted under 35 U.S.C. 154(b) by 982 days.

(21) Appl. No.: 10/185,040

(22) Filed: Jun. 28, 2002

(65) Prior Publication Data

US 2004/0202138 A1 Oct. 14, 2004

(51) Int. Cl.
*H04J 13/04* (2006.01)

(52) U.S. Cl. .................. 370/342; 375/146; 375/267

(58) Field of Classification Search .............. 370/342; 375/146, 267, 299
See application file for complete search history.

(56) References Cited

U.S. PATENT DOCUMENTS

| | | | |
|---|---|---|---|
| 6,347,385 B1* | 2/2002 | Cui et al. | 714/701 |
| 6,553,516 B1* | 4/2003 | Suda et al. | 714/702 |
| 2003/0128674 A1* | 7/2003 | Kong et al. | 370/320 |
| 2003/0131303 A1* | 7/2003 | Kim et al. | 714/755 |

* cited by examiner

*Primary Examiner*—Melvin Marcelo
(74) *Attorney, Agent, or Firm*—Harness, Dickey & Pierce, P.L.C.

(57) ABSTRACT

The present invention relates to a multicarrier direct sequence code division multiple access (DS/CDMA) system using a turbo code with nonuniform repetition coding. In particular, it relates to a multicarrier DS/CDMA system using a turbo code with unequal diversity order in its code symbols instead of using a convolutional code.

5 Claims, 8 Drawing Sheets

MULTICARRIER DS/CDMA SYSTEM USING A TURBO CODE WITH NONUNIFORM REPETITION CODING

BACKGROUND OF THE INVENTION

1. Field of the Invention

The present invention relates to a multicarrier direct sequence code division multiple access (DS/CDMA) system using a turbo code with nonuniform repetition coding. In particular, it relates to a multicarrier DS/CDMA system using a turbo code with unequal diversity order in its code symbols instead of using a convolutional code.

2. Description of the Related Art

With the recent development in mobile communication technology, the analog communication technologies that have been used in prior art, such as time division multiple access (TDMA) and frequency division multiple access (FDMA), are being replaced by code division multiple access (CDMA), a digital communication technology.

CDMA is a method in which a code is assigned to digitized voice information with a broadened frequency band so that each user can transmit signals according to the code. With this method, a voice signal is first divided into bit units to be encoded, and thereafter inserted into communication frequency band. As a result, the accommodation capacity of each channel increases, and the number of users possibly assigned to the same frequency band is increased by 5–10 times compared with the conventional analog-type multiple access technologies. And thus, it is mainly used for mobile communication technology.

CDMA method is employed in IMT-2000 standard, which is being considered to be a standard for next-generation mobile communication such as voice/moving picture data transmission and/or Internet search. However, it has been pointed out that, in CDMA method, the communication quality could be degraded due to the excessive interference caused by different electric powers assigned to multiple users.

A multicarrier DS/CDMA system using a convolutional code has been proposed to prevent the above-described quality degradation in establishing a wideband CDMA system (Y. H. Kim, J. M. Lee, I. H. Song, H. G. Kim and S. C. Kim, "An orthogonal multicarrier DS/CDMA system using a convolutional code," *J. of Korean Electro. Soc.*, vol. 37TC, no. 4, pp. 295–303, April 2000; D. N. Rowitch and L. B. Milstein, "Convolutionally coded multicarrier DS CDMA systems in a multipath fading channel-part II: narrowband interference suppression," *IEEE Trans. Commun.*, vol. 47, no. 11, pp. 1729–1736, November 1999). In this system, the available bandwidth is divided into a set of disjoint equi-width subchannels, and narrowband DS/CDMA waveforms are transmitted in parallel over the subchannels.

The bit error rate of an orthogonal multicarrier DS/CDMA system using a convolutional code described above is relatively improved compared with that of a single-carrier DS/CDMA system in the case that a partial band-interference is being occurred.

In addition to the above-described multicarrier DS/CDMA system using a convolutional code, a multicarrier DS/CDMA system using a turbo code has been introduced to be a more advanced system (A. H. S. Mohammadi and A. K. Khandani, "Unequal error protection on turbo-encoder output bits," *Electron. Letters*, vol. 33, no. 4, pp. 273–274, February 1997; Y. M. Choi and P. J. lee, "Analysis of turbo codes with asymmetric modulation," *Electron. Letters*, vol. 35, no. 1, pp. 35–36, January 1999). In this system, different energies are assigned to the two kinds of outputs, information symbols and parity check symbols, of a turbo encoder in the additive white Gaussian noise (AWGN) channel to increase the Euclidean distance, and thus improve the communication quality That is to say, by using a turbo code instead of a convolutional code, the bit error rate (BER; It indicates the system performance, i.e. communication quality.) is improved such that Eb/No becomes to be 0.7 dB at BER of $10^{-5}$ and rate of ½. Consequently, it provides a communication quality almost approaching the Shannon limit, and thus, a turbo code is generally used for error correction.

However, the prior multicarrier DS/CDMA system using a turbo code has a problem that a stronger signal energy given to one user causes a stronger interference occurring to the other users, and the communication quality is degraded thereby.

Besides, in case of inducing more energy to increase the Euclidean distance, the fading effect due to the fading channel cannot be reduced very much.

SUMMARY OF THE INVENTION

The present invention is proposed to solve the problems of the prior art mentioned above. It is therefore the object of the present invention to provide a multicarrier DS/CDMA system that improves bit error rate to provide a better communication quality by using a turbo code instead of a convolutional code and assigning additional diversity orders to the parity check symbols of a turbo encoder among the two kinds of outputs of a turbo encoder, data bits and parity check symbols.

It is another object of the present invention to increase the number of possible users by reducing the fading effect by increasing the diversity of the codes and the channels.

To achieve the object mentioned above, the present invention presents a multicarrier DS/CDMA system using a turbo code with nonuniform repetition coding comprising: a turbo encoder for encoding input data bits; a repeater/symbol mapper for replicating the turbo code symbols outputted from the turbo encoder into repetition code symbols in frequency domain and mapping the replicated repetition code symbol signals appropriately; at least one first interleaver for changing channels for the turbo code symbols outputted from the repeater/symbol mapper so that the fading effect is properly distributed on the codeword symbols; at least one first multiplier for multiplying a signature sequence to the turbo code symbols, which are properly rearranged by at least one first interleaver, for band-broadening; at least one impulse modulator for modulating the band-broadened signals from at least one first multiplier to an impulse shape; at least one chip wave-shaping filter for smoothening the waveform of the output signals from at least one impulse modulator and eliminating the interference between the symbols; at least one second multiplier for mapping the output signals from at least one chip wave-shaping filter to each frequency band; a first adder for adding all the output signals from at least one second multiplier and transmitting the signals; at least one chip matched filter for chip-matched filtering the signals transmitted from the first adder for each channel; at least one third multiplier for the chip-matched filtered signals for each channel outputted from at least one chip-matched filter transmitting through; at least one lowpass filter for inphase modulating and lowpass filtering the signals transmitted through at least one third multiplier; at least one correlator for sampling the lowpass filtered signals outputted from at least one low-pass filter at each $T_c$ and thereafter correlating the signals with a signature sequence of a user; at least one second interleaver for rearranging the sequence of the signals, correlated with a signature sequence of a desired user, outputted from at least one correlator back to the original sequence by deinterleaving; a symbol demapper for demapping the separated symbol signals outputted from at least one second interleaver; and a turbo decoder for decoding the demapped symbol signals outputted from the symbol demapper.

(RSC) Encoder

DETAILED DESCRIPTION OF THE EMBODIMENTS

Hereinafter, referring to appended drawings, the structures and the operation procedures of the embodiments of the present invention are described in detail.

Figure 1A:
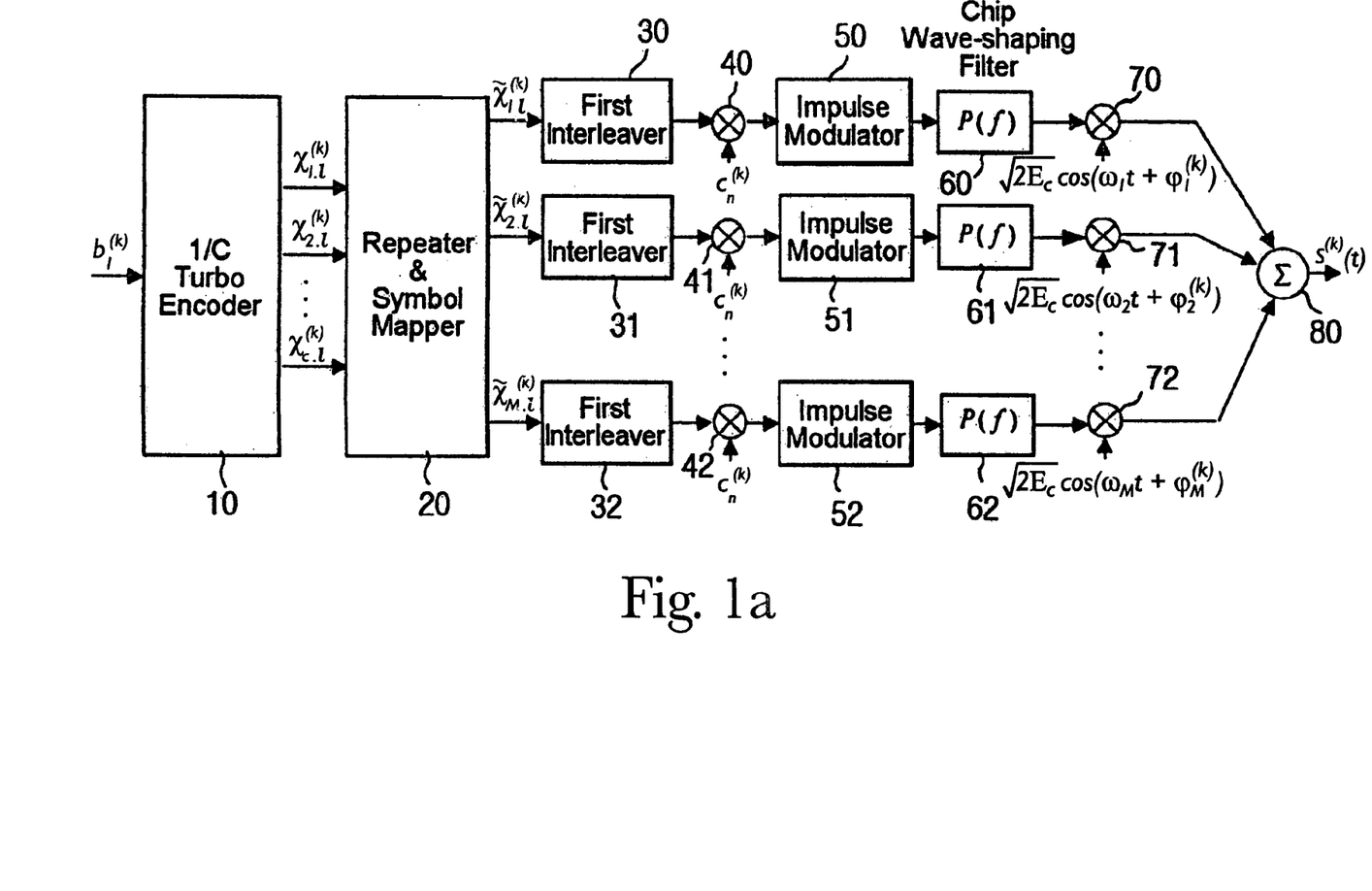
FIG. 1a is a systematic diagram of a transmitter of k-th user among K users communicating with one another by using a multicarrier direct sequence code division multiple access (DS/CDMA) system using a turbo code.

FIG. 1a is a systematic diagram of a transmitter of k-th user among K users communicating with one another by using a multicarrier DS/CDMA system using a turbo code.

As described in FIG. 1a, a transmitter comprises a turbo encoder (10), a repeater/symbol mapper (20), numbers of first interleavers (30, 31, 32), numbers of first multipliers (40, 41, 42), numbers of impulse modulators (50, 51, 52), numbers of chip wave-shaping filters (60, 61, 62), numbers of second multipliers (70, 71, 72) and a first adder (80).

The data bit $b_l^{(k)}$ at time 1 for the k-th user with bit duration $T_b$ is inputted to a rate 1/C turbo encoder (10), whose output symbols are denoted by $\{x_{j,l}^{(k)}, j=1, 2, \ldots, C\}$, and encoded therein.

Figure 1B:
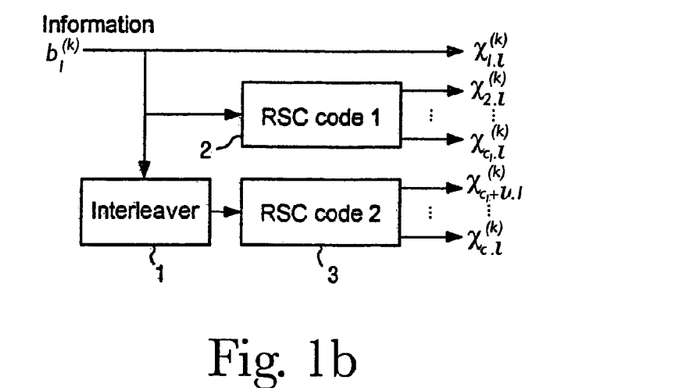
FIG. 1b is a view illustrating the detail structure of a turbo encoder, described in FIG. 1a, of which the bit duration is $T_b$ and the rate is 1/C.

The turbo encoder (10) is described in detail in FIG. 1b.

FIG. 1b is a view illustrating the detail structure of a turbo encoder, described in FIG. 1a, of which the bit duration is $T_b$ and the rate is 1/C.

As described in FIG. 1b, a turbo encoder (10) comprises an interleaver (1), a first recursive systematic convolutional (RSC) encoder (2) and a second recursive systematic convolutional (RSC) encoder (3).

The rates of the first RSC encoder (2) and the second RSC encoder (3) are $1/C_1$ and $1/C_2$, respectively.

For the outputs of the encoder, $x_{1,l}^{(k)}$ denotes the systematically transmitted binary data symbol, $\{x_{j,l}^{(k)}\}_{p1} = \{x_{2,l}^{(k)}, \ldots, x_{C_1,l}^{(k)}\}$ denote the parity check symbols encoded by the first RSC encoder (2), and $\{x_{j,l}^{(k)}\}_{p2} = \{x_{C_1+1,l}^{(k)}, \ldots, x_{C,l}^{(k)}\}$ denote the parity check symbols from the second RSC encoder (3) in which the input signal $b_l^{(k)}$, which is properly rearranged by the interleaver (1), is encoded.

The symbol $x_{j,l}^{(k)}$ is repetition coded at a rate $1/M_j$ and mapped into the subchannels by the repeater/symbol mapper (20) to properly separate, in frequency, the repetition code symbols of each turbo code symbol.

Figure 1C:
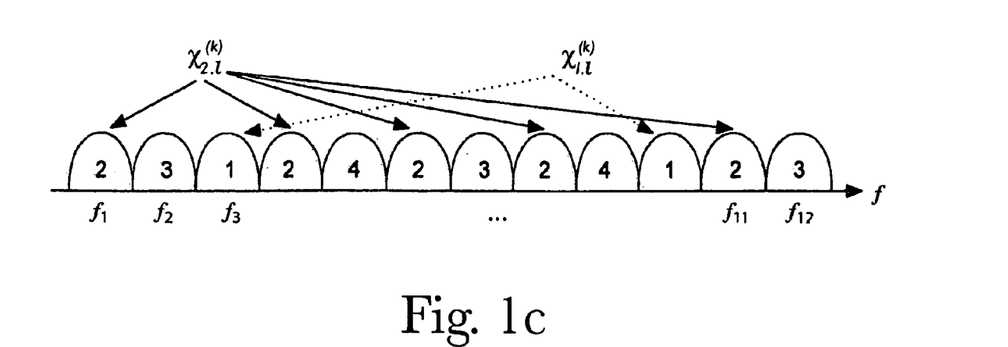
FIG. 1c is a view illustrating an example of symbol mapping when using a turbo code of which M=12 and the rate is ¼ and a repetition vector, which is represented by $(M_1, M_2, M_3, M_4)$, is (2, 5, 3, 2).

Here, an example of symbol mapping by using a symbol mapper is described in FIG. 1c.

FIG. 1c is a view illustrating an example of symbol mapping when using a turbo code of which M=12 and the rate is ¼ and a repetition vector, which is represented by $(M_1, M_2, M_3, M_4)$, is (2, 5, 3, 2).

As described in FIG. 1c, it illustrates an embodiment of mapping 4 turbo code symbols to 12 sub-channels when a repetition vector $(M_1, M_2, M_3, M_4)$ is (2, 5, 3, 2).

Assume that $\{\tilde{x}_{m,l}^{(k)}, m=1, 2, \ldots, M\}$ are the signals outputted from the symbol mapper.

Here, $\tilde{x}_{m,l}^{(k)}$ is the symbol transmitted through the m-th subchannel at time l. More specifically, $\tilde{x}_{m,l}^{(k)}$ is equal to $x_{j,l}^{(k)}$ if m belongs to the index set $A_j$ whose elements are the indexes of the subchannels where $x_{j,l}^{(k)}$ is transmitted.

Numbers of first interleavers (30, 31, 32) described in FIG. 1a rearranges the signals $\{\tilde{x}_{m,l}^{(k)}, m=1, 2, \ldots, M\}$ supplied by the repeater/symbol mapper (20) by channel-interleaving in order that the deep fading effect is properly distributed on the codeword symbols.

Then, numbers of first multipliers (40, 41, 42) multiply signature sequences to the turbo code symbols, which are properly rearranged by numbers of first interleavers (30, 31, 32) and outputs band-broadened signals.

Numbers of impulse modulators (50, 51, 52) modulate the band-broadened signals from numbers of first multipliers (40, 41, 42) into impulse shape and outputs the modulated signals.

In-phase modulators and orthogonal-phase modulators are combined to be used as impulse modulators in a prior multicarrier DS/CDMA system using a convolutional code, however, in-phase modulators are only used as numbers of impulse modulators (50, 51, 52) in the present invention for simplifying the system components.

Numbers of chip wave-shaping filters (60, 61, 62) smoothen the waveform of the impulse-type moderated signals outputted from numbers of impulse modulators (50, 51, 52), eliminates the interference between symbols and outputs them.

Numbers of second multipliers (70, 71, 72) are mapping the output signals from numbers of chip wave-shaping filters (60, 61, 62) to each frequency band.

A first adder (80) adds all the output signals from numbers of second multipliers (70, 71, 72) and transmits them to a receiver.

Here, the transmission signal of a turbo code symbol of k-th user is shown in Equation 1.

$$s^{(k)}(t) = \sqrt{2E_c} \sum_{m=1}^{M} \sum_{n=-\infty}^{\infty} \tilde{x}_{m,[n/N]}^{(k)} c_n^{(k)} p(t - nT_c)\cos(\omega_m t + \varphi_m^{(k)}),$$ [Equation 1]

where, $E_c$: energy-per-chip,

P(t): impulse response of chip wave-shaping filter, $\{c_n^{(k)}\}$: random binary signature sequence with period N, $1/T_c$: chip rate, $\omega_m$: angular frequency of m-th subcarrier, and $\{\phi_m^{(k)}\}$: independent identically distributed (iid) random variables uniformly distributed over $[0, 2\pi)$.

Here, each subchannel is assumed to be a slowly varying frequency nonselective Rayleigh fading with impulse response function represented by Equation 2.

$$h_m^{(k)}(t) = \alpha_m^{(k)} e^{j\theta_m^{(k)}} \delta(t), \quad m=1, 2, \ldots, M,$$ [Equation 2]

where, $\{\alpha_m^{(k)}\}$: fading amplitudes, and $\{\theta_m^{(k)}\}$: random phases.

As shown in the above equation, the fading amplitudes and phases are correlated in time and frequency.

However, the correlation occurred in the fading amplitudes can be reduced by using proper channel interleavers (30, 31, 32) and a symbol mapper.

That is to say, in case that the fading amplitudes are independent identically distributed (iid) Rayleigh random variables with a unit second moment and the phases are iid random variables uniformly distributed over $[0, 2\pi)$, the receiving signal is given by Equation 3.

$$r(t) = \sqrt{2E_c} \sum_{k=1}^{K} \sum_{m=1}^{M} \sum_{n=-\infty}^{\infty} \alpha_m^{(k)} \tilde{x}_{m,[n/N]}^{(k)} c_n^{(k)} p(t - nT_c - \tau_k)\cos(\omega_m t + \phi_m^{(k)}) + n_W(t),$$ [Equation 3]

where, $\{\tau_k\}$ (propagation delay): independent identically distributed (iid) random variables uniformly distributed over $[0, T_b)$, $\phi_m^{(k)}$: $\phi_m^{(k)} + \theta_m^{(k)} - \omega_m \tau_k$, and $n_W(t)$: additive white Gaussian noise (AWGN) having power spectral density (psd) of $\eta_0/2$.

Figure 2:
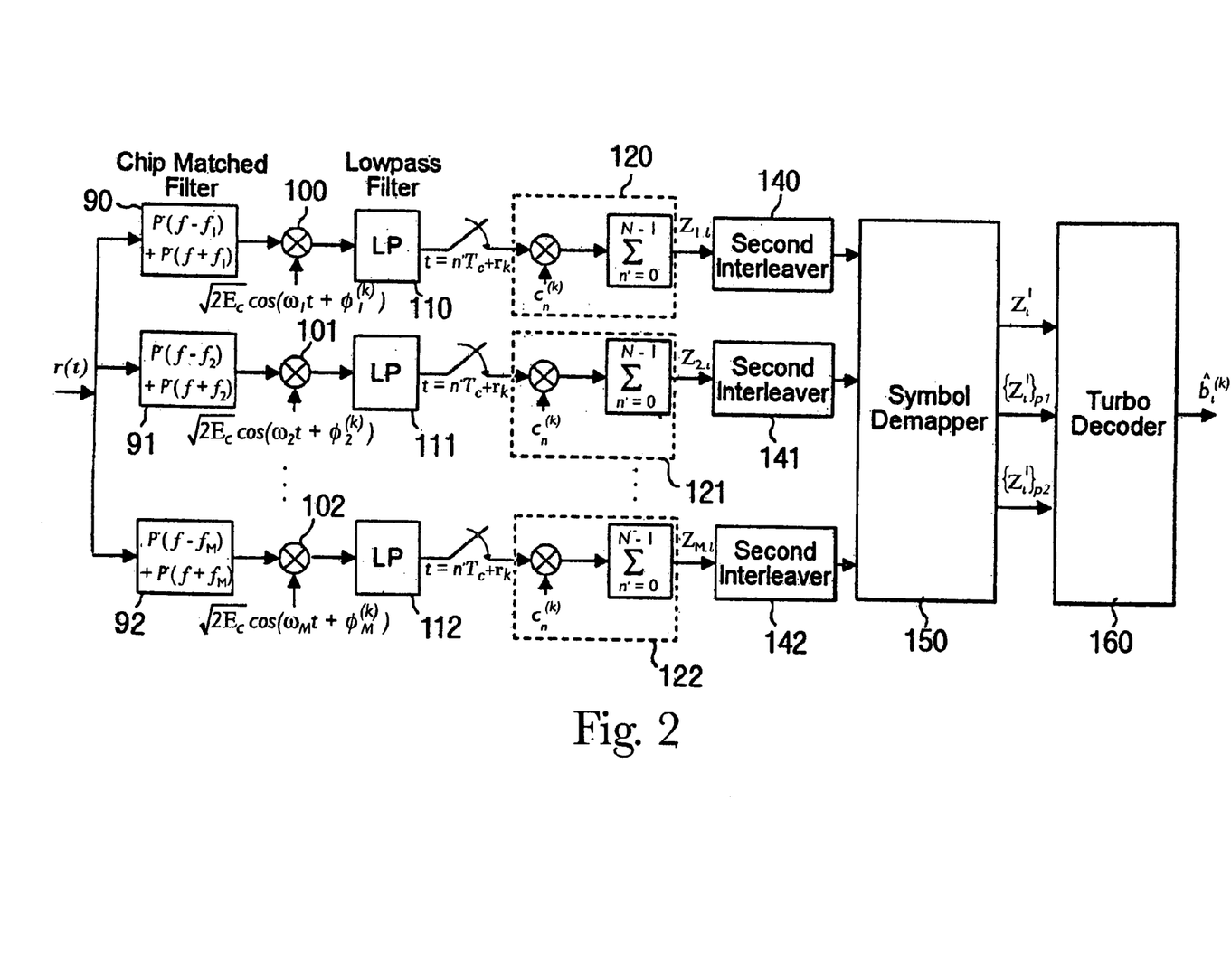
FIG. 2 is a systematic diagram of a multicarrier DS/CDMA receiver using a turbo code.

FIG. 2 is a systematic diagram of a receiver of k-th user among K users communicating with one another by using a multicarrier DS/CDMA system using a turbo code.

As described in FIG. 2, a receiver comprises numbers of chip matched filters (90, 91, 92), numbers of third multipliers (100, 101, 102), numbers of lowpass filters (110, 111, 112), numbers of correlators (120, 121, 122), numbers of second interleavers (140, 141, 142), a symbol demapper (150), and a turbo decoder (160).

Numbers of chip matched filters (90, 91, 92) perform a chip matched filtering on the received signals, transmitted from the transmitter of the other users, for each channel.

Numbers of lowpass filters (110, 111, 112) modulate the chip matched filtered signal for each channel supplied through numbers of third multipliers (100, 101, 102) to be in-phased and perform a lowpass filtering on them.

Here, the outputs of the lowpass filters are sampled every $T_c$ and then correlated with the signature sequence of a desired user by numbers of correlators (120, 121, 122).

Numbers of second interleavers (140, 141, 142) rearrange the sequence of the signals outputted from numbers of correlators (120, 121, 122) back to the original sequence by channel deinterleaving, a symbol demapper (150) is demapping the separated symbol signals, and a turbo decoder (160) decodes the signals.

The chip wave-shaping filter (60), P(f), of the above described transmitter satisfies the Nyquist criterion and is of unit energy. Here, it is defined that $g(t) = F^{-1}\{G(f)\}$, where, $G(f) = |P(f)|^2$ and $F^{-1}$ denotes the inverse Fourier transform.

Decoding procedures in the turbo decoder (160) are now described in detail.

The inputs for an iterative turbo decoder are modeled assuming that the first user (k=1) is a desired user and that perfect carrier, code and bit synchronization is obtained. Then, the correlator output of the q-th subchannel at time 1 can be written as Equation 4.

$$Z_{q,l}^{(1)} = \sum_{n'=0}^{N-1} c_{n'}^{(1)} y_q(lT_b + n'T_c + \tau_1)$$

$$= N\sqrt{E_c}\,\alpha_q^{(1)} \tilde{x}_{q,l}^1 + U_{q,l} + W_{q,l},$$ [Equation 4]

where, $y_q(t)$: the lowpass filter output on the q-th subchannel after being converted to the baseband, $U_{q,1}$: the multiple access interference (MAI) output of the q-th correlator output at time 1, $W_{q,1}$: the additive white Gaussian noise (AWGN) output of the q-th correlator output at time 1.

In has been shown in the prior art that $Z_{q,l}^{(1)}$, conditioned on $\alpha_q^{(1)}$ and $\tilde{x}_{q,l}^1$, is approximately Gaussian, where the approximation is valid for a large number of users and is perfect for K=1.

The means of the random variables, $U_{q,1}$ and $W_{q,1}$, are 0 (zero), and their variances are given by Equation 5.

$$\mathrm{Var}(U_{q,l}) = \frac{N(K-1)E_c}{2T_c}\int_{-\infty}^{\infty}|G(f)|^2\,df, \text{ and}$$

$$\mathrm{Var}(W_{q,l}) = \frac{N\eta_0}{2}.$$ [Equation 5]

Using the equation (Eqn. 5), decoder inputs can be modeled. The decoder input model can be written by Equation 6.

$$z_{q,l} = \alpha_{q,l}\tilde{x}_{q,l} + I_{q,l},$$ [Equation 6]

where, $z_{q,l}, I_{q,l}$: the correlator output and its total noise component respectively, normalized by $N\sqrt{E_c}$, on the q-th subchannel at time 1 after channel deinterleaving.

Here, user indexes on the superscript of symbols are dropped for notational convenience. The MAI plus AWGN term, $I_{q,l}$, is approximately a zero mean Gaussian random variable, and its variance is given by Equation 7.

$$\sigma_q^2 = \frac{K-1}{2NT_c}\int_{-\infty}^{\infty}|G(f)|^2\,df + \frac{\eta_0 M}{2E_b},\qquad\text{[Equation 7]}$$

where, $E_b(=NME_C)$: energy-per-bit.

Before turbo decoding is performed, the normalized correlator outputs are partitioned into C subsets, $\{z_l^j, j=1, 2, \ldots, C\}$, by the symbol demapper.

Here, $z_l^j = \{z_{q,l}, q \in A_j\}$ is the subset composed of the correlator outputs for the subchannels where the turbo code symbol, $x_{j,1}$, is transmitted.

The symbol mapping shown in FIG. 3 is denoted by the following equations:

$z_l^1 = \{z_{3,l}, z_{10,l}\}$, $z_l^2 = \{z_{1,l}, z_{4,l}, z_{6,l}, z_{8,l}, z_{11,l}\}$, $z_l^3 = \{z_{2,l}, z_{7,l}, z_{12,l}\}$, and $z_l^4 = \{z_{5,l}, z_{9,l}\}$.

The C subsets are again divided into three groups: $z_l^1$ corresponding to the systematic data symbol, $\{z_l^j\}_{P_1} = \{z_l^2, \ldots, z_l^{C_1}\}$ corresponding to the parity check symbols of the first RSC decoder, and $\{z_l^j\}_{P_2} = \{z_l^{C_1+1}, \ldots, z_l^C\}$ corresponding to the parity check symbols of the second RSC decoder.

When a rate ¼ turbo code described in FIG. 3 consists of a rate ½ first RSC code (2) and a rate ⅓ second RSC code (3), it follows that $\{z_l^j\}_{P_1} = \{z_l^2\}$ and $\{z_l^j\}_{P_2} = \{z_l^3, z_l^4\}$.

These sets are inputted to a turbo decoder (160) along with the information on the fading amplitudes and noise variances.

Turbo decoding metric on multicarrier DS/CDMA system model using a turbo code with nonuniform repetition coding will be described hereinafter.

The turbo decoder (160) uses an iterative, suboptimal, soft-decoding rule where each constituent RSC code is separately decoded by its decoder. However, the constituent decoders share bit-likelihood information through an iterative process.

In addition, maximum a posteriori (MAP) algorithm is used for both the first and the second RSC decoders with some modification on the branch transition metric to incorporate the appropriate channel statistics for the system model.

For a fully interleaved channel with known fading amplitudes $\alpha = \{\alpha_{1,1}, \ldots, \alpha_{M,1}, \ldots, \alpha_{1,W}, \ldots, \alpha_{M,W}\}$ with the block size of the input data sequence, W, the branch transition metric can be written by Equation 8.

$$\gamma_l((z_l^1, \{z_l^j\}_{P_1}), S_{l-1}, S_l|\alpha) = q(b_l=i|S_{l-1}, S_l)p(z_l^1, \{z_l^j\}_{P_1}|b_l=i, S_{l-1}, S_l, \alpha)Pr\{S_l|S_{l-1}\},\qquad\text{[Equation 8]}$$

where, $S_1$: the encoder state at time 1.

Here, the state can take values between $[0, 2^v-1]$ for an RSC encoder having v memory elements.

In other words, the value of $q(b_l=i|S_{l-1}, S_l)$ is 1 if a transition from states $S_{l-1}$ to $S_l$ occurs, and is 0 otherwise. The probability, $Pr\{S_l|S_{l-1}\}$, is given by Equation 9.

$$Pr\{S_l \mid S_{l-1}\} = \begin{cases} Pr\{b_l = 1\}, & \text{when } q(b_l = 1 \mid S_{l-1}, S_l) = 1, \\ Pr\{b_l = 0\}, & \text{when } q(b_l = 0 \mid S_{l-1}, S_l) = 1, \\ 0, & \text{otherwise.} \end{cases}\qquad\text{[Equation 9]}$$

Here, a priori probabilities, $Pr\{b_l=i\}$ are estimated by the other decoder through the iterative decoding process.

The conditional probability, $p(\bullet|\bullet)$, appeared in Equation 8, is given by Equation 10.

$$p(z_l^1, \{z_l^j\}_{P_1} \mid b_l = i, S_{l-1}, S_l, \alpha) = p(z_l^1 \mid b_l = \qquad\text{[Equation 10]}$$

$$i, S_{l-1}, S_l, \alpha)p(\{z_l^j\}_{P_1} \mid b_l = i, S_{l-1}, S_l, \alpha) =$$

$$\prod_{q \in A_1} \frac{1}{\sqrt{2\pi\sigma_q^2}} \exp\left\{-\frac{(z_{q,l} - \alpha_{q,l}x_{1,l}(i))^2}{2\sigma_q^2}\right\} \times$$

$$\prod_{j=2}^{C_1}\prod_{q \in A_j} \frac{1}{\sqrt{2\pi\sigma_q^2}} \exp\left\{-\frac{(z_{q,l} - \alpha_{q,l}x_{j,l}(i, S_{l-1}, S_l))^2}{2\sigma_q^2}\right\} =$$

$$B_l \exp\left\{\left(\sum_{q \in A_1}\frac{\alpha_{q,l}z_{q,l}}{\sigma_q^2}\right)x_{1,l}(i) + \sum_{j=2}^{C_1}\left(\sum_{q \in A_j}\frac{\alpha_{q,l}z_{q,l}}{\sigma_q^2}\right)x_{j,l}(i, S_{l-1}, S_l)\right\}.$$

Here, $x_{1,l}(i) = \pm 1$ according to $b_l = i$; $x_{j,l}(i, S_{l-1}, S_l) = \pm 1$ according to the value of the j-th code symbol generated when the state transits from $S_{l-1}$ to $S_1$ with input, $b_l = i$; and $B_1$ is a constant which has no influence on the decoding process.

In a similar way, the transition metric for the second RSC decoder can be obtained with the interleaved version of $z_l^1$ and the other sets of parity check outputs, $\{z_l^j\}_{P_2}$.

With the transition metrics described above, the log-likelihood ratio (LLR) of the l-th data bit, $b_l$, is computed at each decoder by Equation 11.

$$L_k(\hat{b}_l) = \log \frac{\Pr\{b_l = 1 \mid \text{observation}\}}{\Pr\{b_l = 0 \mid \text{observation}\}}$$ [Equation 11]

$$= \log \frac{\sum_{S_l} \sum_{S_{l-1}} \gamma_1((z_l^1, \{z_l^j\}_{P_k}), S_{l-1}, S_l \mid \alpha) \varepsilon_{l-1}(S_{l-1}) \beta_l(S_l)}{\sum_{S_l} \sum_{S_{l-1}} \gamma_0((z_l^1, \{z_l^j\}_{P_k}), S_{l-1}, S_l \mid \alpha) \varepsilon_{l-1}(S_{l-1}) \beta_l(S_l)},$$

where,
$L_k(\bullet)$: LLR computed by the decoder k(=1, 2),
$\epsilon_l(\bullet)$: forward recursion, and
$\beta_l(\bullet)$: backward recursion.

Here, the forward recursion is generally denoted by $\alpha_l(\bullet)$, however, it is replaced by $\epsilon_l(\bullet)$ in Equation 11 to avoid confusion with the fading amplitudes.

With the branch transition metric and LLR obtained by Equation 11, code symbols are decoded through an iterative process.

The turbo code is also denoted by a (C(W+v),W) block code. Here, W is the size of the input data sequence and Cv tail bits are appended to terminate the first RSC encoder state to the all-zero state. The effect of tail bits can be neglected when W is much larger than v, the memory size of constituent code.

It can be assumed that the all-zero codeword $x=\{x_{1,1},\Lambda, x_{C,1},\Lambda,x_{1,W},\Lambda,x_{C,W}\}$ is transmitted since the turbo code is a linear code.

Then, the union bound on the probability of word error under maximum likelihood (ML) decoding can be written as Equation 12.

$$P_W \leq \sum_{d=1}^{CW} A(d) P_2(d),$$ [Equation 12]

where,
A(d): number of codewords with Hamming weight d, and
$P_2(d)$: pairwise error probability that the ML decoder will prefer a particular codeword $\hat{x}$ of total Hamming weight d to the all-zero codeword x.

Since it is difficult to obtain A(d) for a specific interleaver, an average upper bound constructed with a random interleaver is proposed in the prior art (D. Divsalar, S. Dolinar, and F. Pollara, "Transfer function bounds on the performance of turbo codes," *TDA Progress Report* 42–122, Jet Propul. Lab., Pasadena, USA, pp. 44–55, August 1995).

From the results of the prior art mentioned above, the average weight distribution is given by Equation 13.

$$\overline{A}(d) = \sum_{i=1}^{W} \binom{W}{i} p(d \mid i),$$ [Equation 13]

where,
p(d|i): probability that an input data sequence with Hamming weight i produces a codewoed with Hamming weight d.

Thus, the average union bound is given by Equation 14.

$$\overline{P}_W \leq \sum_{i=1}^{W} \binom{W}{i} \sum_{d=1}^{CW} p(d \mid i) P_2(d).$$ [Equation 14]

Similarly, the average union bound on the probability of bit error is given by Equation 15.

$$\overline{P}_b \leq \sum_{i=1}^{W} \frac{i}{W} \sum_{d=1}^{CW} p(d \mid i) P_2(d).$$ [Equation 15]

In the system of the present invention, the C distinct turbo code symbols for a given input symbol may go through channels with different noise levels and diversity orders.

Thus, it has to be taken into consideration how a codeword Hamming weight is constructed from the different kinds of turbo code symbols.

For this purpose, a turbo codeword $\hat{x}$ is divided into C code fragments. Here, the j-th fragment is given by $\hat{x}^J=\{\hat{x}_{J,1}, \hat{x}_{J,2},\Lambda,\hat{x}_{J,W}\}$. If $d_j$ denotes the Hamming weight of $\hat{x}^J$, Equation 15 can be rewritten by Equation 16.

$$\overline{P}_b \leq \sum_{d_1=1}^{W} \frac{d_1}{W} \binom{W}{d_1} \sum_{\substack{(d_2,d_3,\Lambda,d_C) \\ d(=\sum_{j=1}^{C} d_j)=1}} p(d_2, d_3, \Lambda, d_C \mid d_1) P_2(d_1, d_2, \Lambda, d_C).$$ [Equation 16]

Here, $p(d_2,d_3,\Lambda,d_C|d_1)$ is the probability that an input data sequence of weight $d_1$ produces a codeword of total weight $d=\Sigma_{j=1}^{C} d_j$ with the code fragment weight $d_j$ of $\hat{x}^j$, and $P_2(d_1,d_2,\Lambda,d_C)$ is the pairwise error probability that the ML decoder chooses a particular codeword $\hat{x}^J$ with fragment weights $(d_1,d_2,\Lambda,d_C)$ rather than the all-zero codeword.

In case that a random interleaver (i.e. random sequence) is used in the system described in FIG. 2, an input data sequence of weight $d_1$ is randomly permuted to some other sequence of weight $d_1$ at the input of the second RSC encoder.

That is to say, the permutation does not depend on the pattern of input data sequence on where the nonzero bits are located. And thus, the code fragments generated by the second RSC encoder with the permuted data sequence is different from those generated by the first RSC encoder with the original input data sequence as in the prior art by D. Divsalar, et al.

The probability $p(d_2,\Lambda,d_C|d_1)$ is therefore decomposed into Equation 17.

$$p(d_2,\Lambda,d_C|d_1)=p_1(d_2,\Lambda,d_{C_1}|d_1)p_2(d_{C_1+1},\Lambda,d_C|d_1). \qquad \text{[Equation 17]}$$

Here, $p_1(d_{s_i},\Lambda,d_{e_i}|d_1)$ is the probability that the RSC encoder i produces the codeword fragments $\{\hat{x}^j\}_{J=S_1}^{e_1}$ of weights $(d_{s_i},\Lambda,d_{e_i})$ with input data sequence of weight $d_1$. And, $s_i$ and $e_i$ denote the starting index and the ending index, respectively, of the codeword fragments $\hat{x}^J$ produced by the RSC encoder i. The probability $p_i(d_{s_i},\Lambda,d_{e_i}|d_1)$ is given by Equation 18.

$$p_i(d_{s_i},\Lambda,d_{e_i}|d_1) = \frac{t_i(W,d_1,d_{s_i},\Lambda,d_{e_i})}{\binom{W}{d_1}}, i=1,2, \qquad \text{[Equation 18]}$$

where, $\binom{W}{d_1}$:

number of all input data sequences of weight $d_1$, and $t_i(W,d_1,d_{s_i},\Lambda,d_{e_i})$: number of codewords whose code fragments produced by the RSC encoder i have the weights $(d_{s_i},\Lambda,d_{e_i})$.

Here, $t_i(\bullet)$ is obtained by using the transfer function method proposed in the prior art by D. Divsalar, et al with some modification such that an RSC code transfer function enumerates all the fragment weights.

Figure 3A:
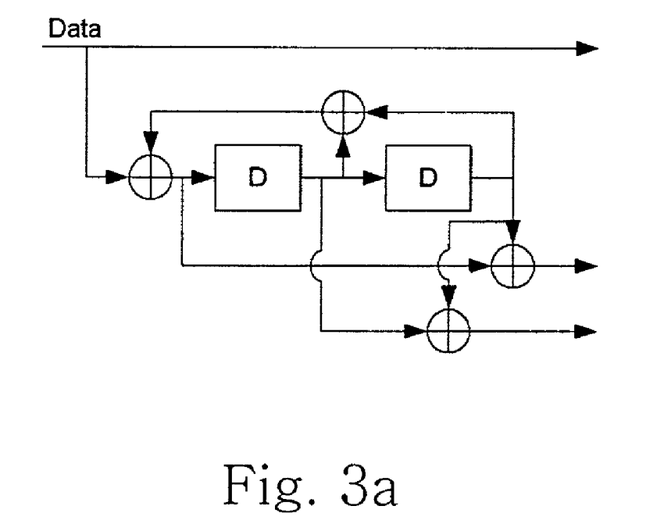
FIG. 3a and FIG. 3b are views illustrating the structure and the state of a rate ⅓ recursive systematic convolutional (RSC) encoder with a generator denoted in octal by (1, ⁵⁄₇, ³⁄₇).
Figure 3B:
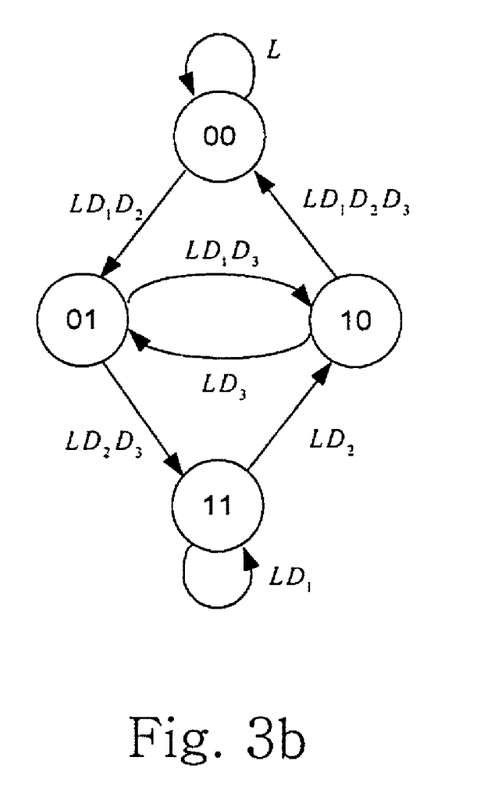

FIG. 3a and FIG. 3b are views illustrating the structure and the state of a rate ⅓ RSC encoder with a generator denoted in octal by (1, 5/7, 3/7).

In FIG. 3b, dummy variables are used to specify the path (L), the input weight ($D_1$), and the weight of code fragments ($D_2$, $D_3$) corresponding to the parity check symbols.

With a similar method to that of the prior art by D. Divsalar, et al, the state transition matrix of the code is obtained as Equation 19.

$$A(L, D_1, D_2, D_3) = \begin{bmatrix} L & LD_1D_2 & 0 & 0 \\ 0 & 0 & LD_1D_3 & LD_2D_3 \\ LD_1D_2D_3 & LD_3 & 0 & 0 \\ 0 & 0 & LD_2 & LD_1 \end{bmatrix}. \qquad \text{[Equation 19]}$$

Using Equation 19, the transfer function is derived as Equation 20.

$$T(L, D_1, D_2, D_3) = \lfloor (I - A(L, D_1, D_2, D_3))^{-1} \qquad \text{[Equation 20]}$$

$$A(L, 1, D_2, D_3)^v \rfloor_{(0,0)}$$

$$= \sum_{l \geq 0} \sum_{d_1 \geq 0} \sum_{d_2 \geq 0} \sum_{d_3 \geq 0}$$

$$t(l, d_1, d_2, d_3) L^l D_1^{d_1} D_2^{d_2} D_3^{d_3}.$$

Here, $(0,0)$ denotes the $(0,0)$ element of the matrix and the term $A(L,1,D_2,D_3)$ represents the contribution of tail bits in which neither path nor input data weight is accumulated. Using the transfer function obtained in this way, $t(W,d_1,d_2,d_3)$ can be obtained by the recursion as described in the prior art by D. Divsalar, et al.

Besides, the pairwise error probability $P_2(d_1,d_2,\Lambda,d_C)$ can be obtained when the channel side information such as fading amplitudes, $\alpha$, and noise variance at each subchannel, $\{\sigma_q^2, q=1, 2,\Lambda,M\}$, is available.

That is, the conditional probability of incorrectly decoding the all-zero codeword x into a particular codeword $\hat{x}$ with code fragment weights $(d_1,d_2,\Lambda,d_C)$, conditioned on $\alpha$, is given by Equation 21.

$$P(x,\hat{x}|\alpha) = Q\left(\sqrt{\sum_{j=1}^{C} \sum_{l \in \xi_j} \sum_{q \in A_j} \alpha_{q,l}^2 / \sigma_q^2}\right), \qquad \text{[Equation 21]}$$

where, $$Q(x) = \frac{1}{\sqrt{2\pi}} \int_x^\infty e^{-\frac{u^2}{2}} du,$$

and $\xi_j$: index set of l such that $x_{J,l} \neq \hat{x}_{J,l}$.

Here, $d_j$ is the cardinality of $\xi_j$, since a codeword fragment $\hat{x}^J$ differs in $d_j$ places from the all-zero codeword fragment $x^J$.

Thus, the average pairwise error probability, averaged over $\alpha$, is given by Equation 22.

$$P_2(d_1, d_2, \Lambda, d_C) = \int_0^\infty \Lambda \int_0^\infty Q\left(\sqrt{2\mu(x, \hat{x}|\alpha)}\right) \prod_{j=1}^C \prod_{l \in \varepsilon_j} \prod_{q \in A_j} p_\alpha(\alpha_{q,l}) d\alpha_{q,l},$$ [Equation 22]

where, $\mu(x,\hat{x}|\alpha) = \Sigma_{J=1}^C \Sigma_{l \in \varepsilon_j} \Sigma_{q \in A_j} \alpha_{q,l}^2 / 2\sigma_q^2$, and $p_\alpha(y) = 2ye^{-y^2}$, for $y \geq 0$.

Since it is difficult to obtain the exact $P_2(d_1,d_2,\Lambda,d_C)$ for all possible values of $(d_1,d_2,\Lambda,d_C)$, a bound on the pairwise error probability is obtained instead by using the method proposed by Slimane et al (S. B. Slimane and T. Le-Ngoc, "Tight bounds on the error probability of coded modulation schemes in Rayleigh fading channels," *IEEE Trans. Vehic. Technol.*, vol. 44, no. 1, pp. 121–130, February 1995).

In this method, it is defined that $\alpha_{q,l}' = \alpha_{q,l}\sqrt{1+1/2\sigma_q^2}$, and thus Equation 23 can be derived.

$$P_\alpha(\alpha_{q,l})|d\alpha_{q,l}| = 2\alpha_{q,l}e^{-\alpha_{q,l}^2}|d\alpha_{q,l}|$$ [Equation 23]

$$= \frac{e^{\alpha_{q,l}'^2(2\sigma_q^2+1)}}{1+1/2\sigma_q^2} 2\alpha_{q,l}'e^{-\alpha_{q,l}'^2}|d\alpha_{q,l}'|.$$

By using Equation 23, Equation 22 can be rewritten as Equation 24.

$$P_2(d_1, d_2, \Lambda, d_C) = \prod_{j=1}^C \prod_{q \in A_j} \left(\frac{1}{1+1/2\sigma_q^2}\right)^{d_j} \int_0^\infty \Lambda \int_0^\infty Q\left(\sqrt{2\mu(x, \hat{x}|a)}\right) e^{\mu(x,\hat{x}|a)} \prod_{j=1}^C \prod_{l=1}^{d_j} \prod_{q \in A_j} p_\alpha(a_{q,l}') d a_{q,l}',$$ [Equation 24]

where, $\mu(x,\hat{x}|\alpha) = \Sigma_{J=1}^C \Sigma_{l \in \varepsilon_j} \Sigma_{q \in A_j} \alpha_{q,l}'^2/(2\sigma_q^2+1)$, and $p_\alpha(a_{q,l}') = 2a_{q,l}' e^{-a_{q,l}'^2}$, for $\alpha_{q,l}' \geq 0$.

Besides, defining the minimum and the maximum values among the $\{\sigma_q^2, q=1, 2,\Lambda,M\}$ to be $\sigma_{min}^2$ and $\sigma_{max}^2$, it follows that $w_{min}^2 v \leq \mu(x, \hat{x}|\alpha) \leq w_{max}^2 v$, where $$w_{min} = \sqrt{\frac{1}{2\sigma_{max}^2+1}}, \quad w_{max} = \sqrt{\frac{1}{2\sigma_{min}^2+1}},$$

and $v = \Sigma_{J=1}^C \Sigma_{l \in \varepsilon_j} \Sigma_{q \in A_j} \alpha_{q,l}'^2$.

More specifically, the random variable v is the sum of $d_t = \Sigma_{J=1}^C d_J M_J$ Rayleigh random variables with unit second moment. That is, v is a chi-square random variable with $2d_t$ degrees of freedom.

Thus, Equation 24 is bounded by Equation 25.

$$P_2(d_1, d_2, \Lambda, d_C) \leq K(d_t, w_{min}) \prod_{j=1}^C \prod_{q \in A_j} \left(\frac{1}{1+1/2\sigma_q^2}\right)^{d_j},$$ [Equation 25]

where, $$K(d_t, w) = \int_0^\infty Q(w\sqrt{2v}) e^{w^2 v} p_v(v) dv = \frac{1}{2^{2d_t}} \sum_{k=1}^{d_t} \binom{2d_t-k-1}{d_t-1} \frac{2^k}{(1+w)^k}.$$

In this way, the average bit error probability is bounded as Equation 26.

$$\overline{P}_b \leq \sum_{d_1=1}^W \frac{d_1}{W} \binom{W}{d_1} \sum_{\substack{(d_2,d_3,\Lambda,d_C) \\ d(=\Sigma_{j=1}^C d_j)=1}} p(d_2,d_3,\Lambda,d_C|d_1) \, K(d_t, w_{min}) \prod_{j=1}^C \prod_{q \in A_j} \left(\frac{1}{1+1/2\sigma_q^2}\right)^{d_j}.$$ [Equation 26]

Since it is difficult to calculate $K(d_t, w_{min})$ in Equation 26 for large values of $d_t$ due to the numerical problem and calculation time, Equation 26 is further upper bounded as Equation 27 by using the fact that $K(d,w)$ is a monotonically decreasing function of $d_t$.

$$\overline{P}_b \le K(d_{t,\min}, w_{\min}) \sum_{d_1=1}^{W} \frac{d_1}{W}\binom{W}{d_1} \sum_{\substack{(d_2,d_3,\Lambda,d_C) \\ d(=\sum_{j=1}^{C} d_j)=1}} p(d_2,d_3,\Lambda, d_C|d_1) \prod_{j=1}^{C} \prod_{q \in A_j} \left(\frac{1}{1+1/2\sigma_q^2}\right)^{d_j}, \quad \text{[Equation 27]}$$

where $$d_{t,\min} \equiv \min_{(d_1,d_2,\Lambda,d_C)} \sum_{j=1}^{C} d_j M_j :$$

total minimum distance of the codewords resulting after repetition coding is applied to the turbo code symbols.

Here, if the noise variance is the same for all the sub-channels such that $\sigma_q^2 = \sigma^2$, Equation 27 can be simplified as Equation 28.

$$\overline{P}_b \le K(d_{t,\min}, w_{\min}) \sum_{d_1=1}^{W} \frac{d_1}{W}\binom{W}{d_1} \sum_{\substack{(d_2,d_3,\Lambda,d_C) \\ d(=\sum_{j=1}^{C} d_j)=1}} p(d_2,d_3,\Lambda, d_C|d_1) \left(\frac{1}{1+1/2\sigma^2}\right)^{\sum_{j=1}^{C} d_j M_j}. \quad \text{[Equation 28]}$$

Even though average union bounds are known to accurately estimate the performance of a turbo code in the moderate to high signal-to-noise ratio (SNR) region, called the error floor region, it is difficult to obtain the number of codewords for all possible code fragment weights for large values of W and C. Thus, in the present invention, the performance of a turbo code is estimated by an asymptotic performance which shows the behavior of the BER in the moderate to high SNR region as the random interleaver gets large.

There are two important factors of turbo codes: the inetrleaving (permutation) of input data sequences and the recursiveness of the constituent codes. The interleaver matches the low weight output of one encoder with the high weight output of the other, thereby reduces the probability that the net codeword has low weights.

On the other hand, the recursiveness of the constituent codes eliminates the codewords due to input data sequences of weight 1 which remain in the same pattern after interleaving. Thus, the minimum weight of input data sequences is 2 for turbo coding, and it is less likely for turbo codewords to have low weight as either the weight of the input data sequences or the size of the interleaver increases.

That is to say, the probability that an input data sequence of weight 2 which generates the lowest output weight at the first RSC encoder is permuted to the pattern which generates the lowest output weight at the second RSC encoder is approximately 2/W, while the probability for an input data sequence of weight 3 is approximately $6/W^2$ for random interleaving.

Thus, the minimum weight of the codewords due to input data sequences of weight 2, defined as the effective free distance, dominates the performance in the moderate SNR region as the size of the random interleaver gets large.

On the other hand, the BER term due to the codewords of total minimum distance $d_{t,min}$, dominates the performance in the high SNR region, since the BER terms in Equation 26 decrease fast as the SNR increases at the $d_t$ power of the inverse SNR, and thus the BER terms due to $d_t(>d_{t,min})$ are negligible compared to that due to $d_{t,min}$.

Based on these observations, the asymptotic performance considering the two BER terms due to the effective free distance and total minimum distance in Equation 26 is given by Equation 29.

$$\overline{P}_{b,asy} \equiv B_{ef} K(d_{t,ef}, w_{\min}) \prod_{j=1}^{C} \prod_{q \in A_j} \left(\frac{1}{1+1/2\sigma_q^2}\right)^{d_{j,ef}} + \quad \text{[Equation 29]}$$
$$B_{\min} K(d_{t,\min}, w_{\min}) \prod_{j=1}^{C} \prod_{q \in A_j} \left(\frac{1}{1+1/2\sigma_q^2}\right)^{d_{j,\min}},$$

where, $$B_{ef} = \frac{2}{W}\binom{W}{2} p(d_{2,ef}, \Lambda, d_{C,ef}|2),$$

$$B_{\min} = \frac{d_{1,\min}}{W}\binom{W}{d_{1,\min}} p(d_{2,\min}, \Lambda, d_{C,\min}|d_{1,\min}),$$

$d_{j,ef}$: j-th code fragment weight contributing to the effective free distance $d_{ef} = \sum_{j=1}^{C} d_{j,ef}$, $d_{t,ef} = 2M_1 + \sum_{j=2}^{C} d_{j,ef} M_j$: total effective free distance after the repetition coding is applied to the turbo code symbols, and $d_{j,min}$: j-th code fragment weight contributing to the total minimum distance $d_{t,min}$.

Figure 4:
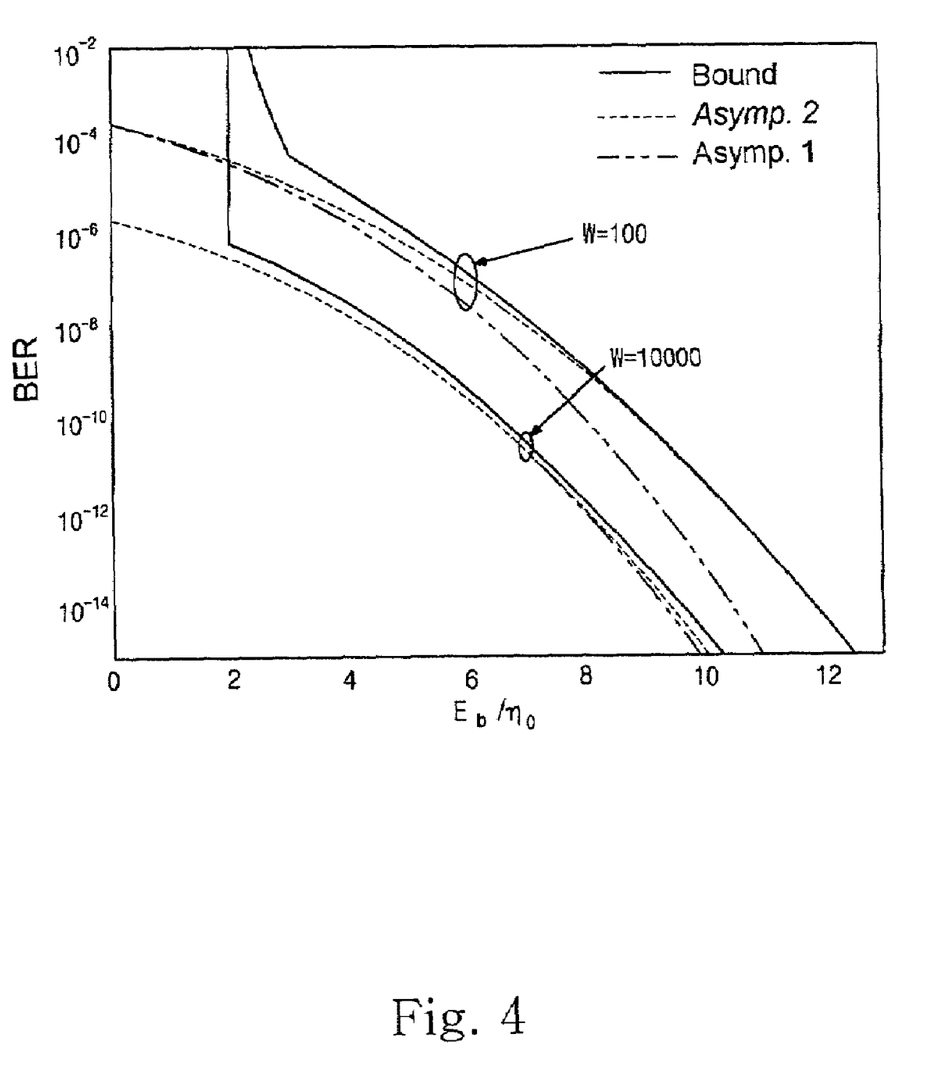
FIG. 4 is a graph showing the union bound and the asymptotic performance with one bit error rate (BER) term, and the asymptotic performance of two BER terms when K=1, M=12, W=100, W=1000 and a rate ⅓ turbo code is used with a repetition vector of (4, 4, 4).

FIG. 4 compares the union bound, the asymptotic performance with one BER term due to the effective free distance (Asymp 1), and the asymptotic performance with two BER terms due to the effective free distance and total minimum distance (Asymp 2) when K=1, M=12, W=100, W=10000 and a rate ⅓ turbo code is used with a repetition vector of (4, 4, 4).

As described in FIG. 4, while Asymp 1 deviates from the union bound at high SNR when W=100, Asymp 2 quite well estimates the union bound.

Thus, it will be enough to find the minimum distance and the effective free distance of a turbo code to estimate the performance in the error floor region.

In addition, the performance of the proposed system is evaluated in the present invention for various repetition vectors $(M_1, M_2, \Lambda, M_C)$. Either the average union bound or the asymptotic performance is used to estimate the performance in the error floor region.

Various simulations were also carried out in the present invention for the low SNR region where neither the bound nor the asymptotic performance can be applied. Random interleavers are used for the permutation of input data sequences, and the number of decoding iterations is 15 for all simulation results.

It is assumed that G(f) is a raised-cosine filter with rolloff factor 0.5, and the total processing gain due to spreading and coding is fixed such that $PG_t$=NM=512 for all simulation results.

Here, the number M of subcarriers is first chosen, and N is then determined by the largest integer less than $PG_t$/M. The generating polynomial of a turbo code is denoted by $(1,g_2/h_2,\Lambda,g_C/h_C)$, where $g_j$ and $h_j$ are the forward and the feedback polynomials in octal for the j-th parity check symbols.

First, the performance is investigated when K=1 (i.e. single user case).

Figure 5:
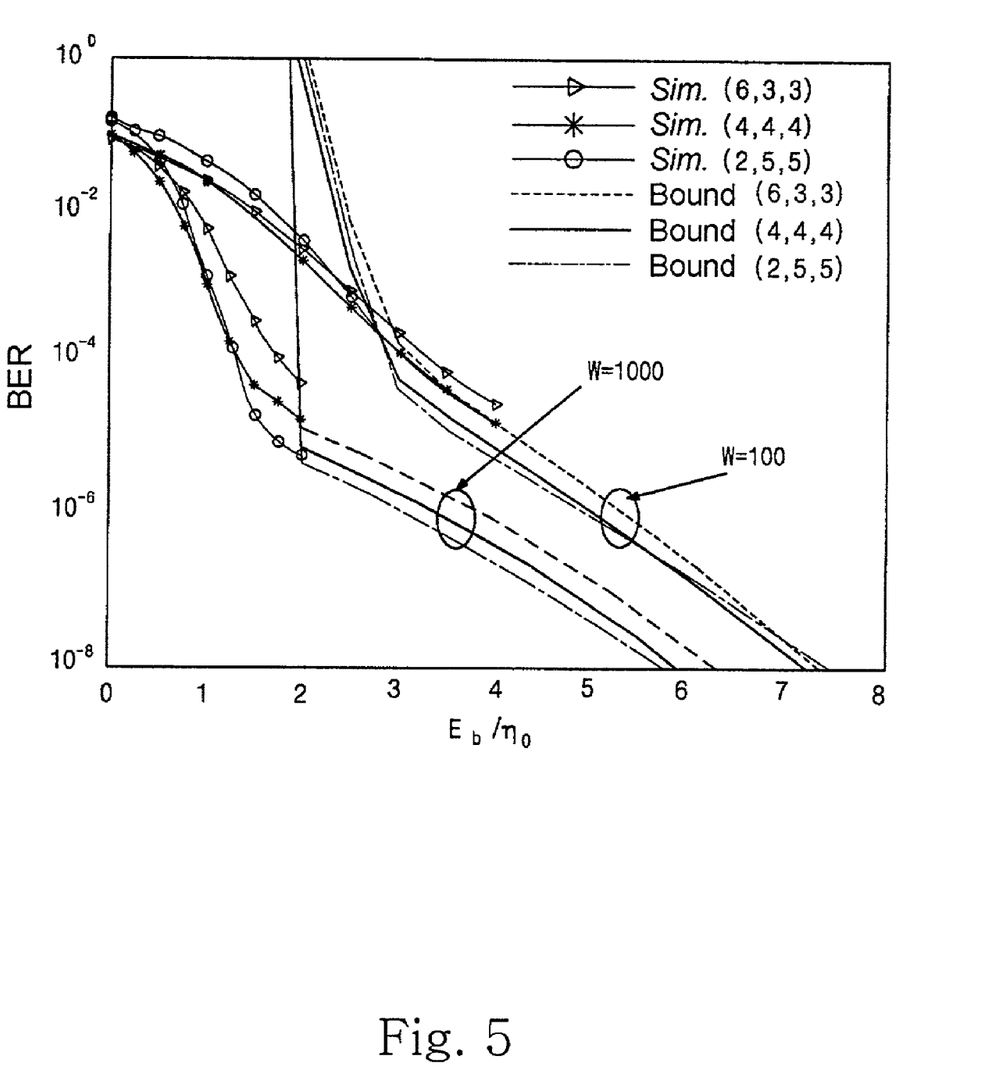
FIG. 5 is a graph showing the bounds with simulation results for three different repetition compositions when K=1, M=12, W=100, W=10000 and a rate ⅓ turbo code is used.

FIG. 5 compares the results from simulations with the bounds for three repetition combinations when W=100 and W=1000 and a rate ⅓ turbo code with generator (1, 5/7, 5/7) is used.

The turbo code used for performance investigation is the one with the best effective free distance among the codes of the same memory.

In FIG. 5, it is observed that the bounds fall slightly below the simulation results, which, in part, results from the fact that the bounds are based on ML decoding and the simulation results are obtained with the suboptimal iterative decoding algorithm.

Such a behavior was also observed in the prior art (S. Benedetto and G. Montorsi, "Design of parallel concatenated convolutional codes," IEEE Trans. Commun., vol. 44, pp. 591–600, may 1996), where the convergence of the simulated performance toward the analytical bounds was shown for an AWGN channel.

Another observation is that the system with a (2, 5, 5) repetition vector performs better in the error floor region as W increases. This effect arises because the effective free distance dominates the performance as W increases.

The turbo code used for FIG. 5 has an effective free distance $d_{ef}$=10, whereas the code fragment weights are $d_{1,ef}$=2, $d_{2,ef}$=4, and $d_{3,ef}$=4.

After repetition coding is applied, the total effective free distance becomes $d_{t,ef}$=36, $d_{t,ef}$=40, and $d_{t,ef}$=44 for the (6, 3, 3), (4, 4, 4), and (2, 5, 5) repetition vectors, respectively.

Thus, the BER at which the error floor begins can be lowered by giving more diversity to the parity check symbols and thereby increasing the total effective free distance.

In addition, FIG. 5 shows the simulation results of the performance of the three repetition methods in the low SNR region when W=1000.

It is observed that the repetition vector processing better performance in the error floor region shows somewhat worse performance for very low SNRs. The reason for such behavior may be explained by the following conjecture.

The log-likelihood ratio (LLR) in Equation 11 can be partitioned as Equation 30.

$$L_k(\hat{b}_l) = L_{c,k}(\hat{b}_l) + L_{e,k}(\hat{b}_l) + L_{p,k}(\hat{b}_l),$$

where $$L_{c,k}(\hat{b}_l) = 2 \sum_{q \in A_1} \frac{\alpha_{q,l} z_{q,l}}{\sigma_q^2};$$

constituent due to the channel measurement of the systematic data, $$L_{e,k}(\hat{b}_l) = \log \frac{\sum_{S_l} \sum_{S_{l-1}} \gamma_1(\{z_l^j\}_{P_k}, S_{l-1}, S_l|\alpha)\varepsilon_{l-1}(S_{l-1})\beta_l(S_l)}{\sum_{S_l} \sum_{S_{l-1}} \gamma_0(\{z_l^j\}_{P_k}, S_{l-1}, S_l|\alpha)\varepsilon_{l-1}(S_{l-1})\beta_l(S_l)};$$

extrinsic information obtained from the decoding process, and $L_{p,k}(\hat{b}_l)$: a priori probability which is given by the extrinsic information from the other decoder in the iterative decoding process.

It is expected that the decision of the data bit becomes more reliable by the use of both $L_{e,k}(\hat{b}_l)$ and $L_{p,k}(\hat{b}_l)$ through the iterative decoding process. However, at low SNR values, one decoder outputs unreliable erroneous extrinsic information, which adds erroneous information to the other decoder, and thus it is hard for the decoders to converge on a decision of the transmitted data.

Thus, if a higher diversity order is given to the systematic data, a lower diversity order is given to the parity check symbols, and the effect of erroneous information exchange will be reduced in the low SNR region.

However, as the decoder begins to perform better as the SNR increases, the extrinsic information from one decoder enhances the ability of the other decoder to out put more reliable LLR, and vice versa.

Thus, there is a tradeoff between the performance in the low SNR region and that in the high SNR region according to how much diversity is given to the data symbols and how much is given to the parity check symbols.

Figure 6:
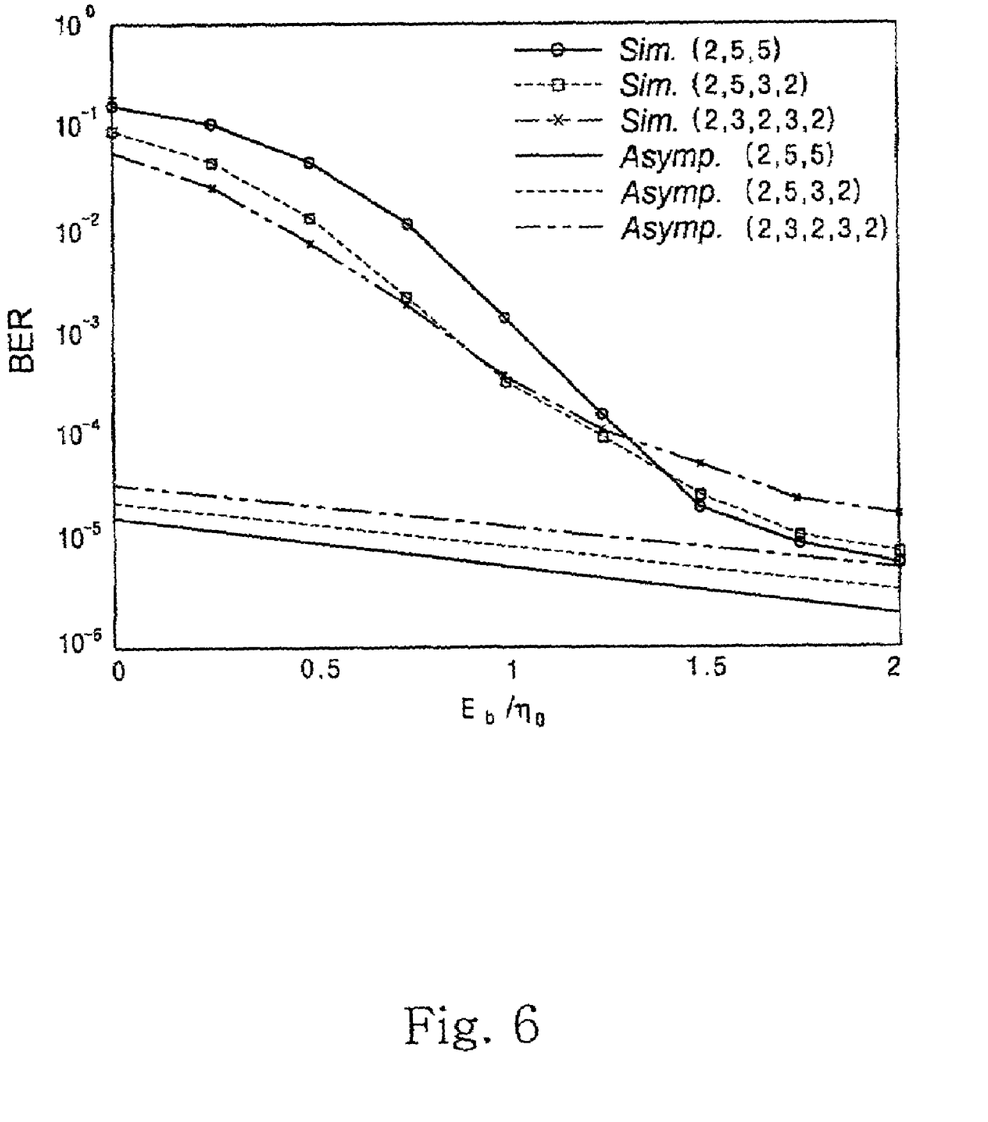
FIG. 6 is a graph showing the bit error rate along with $E_b/\eta_0$ when K=1, M=12, W=1000 and three turbo codes of different rates are used.

FIG. 6 is a graph showing the bit error rate along with $E_b/\eta_0$ when K=1, M=12, W=1000 and three turbo codes of different rates are used, and Table 1 shows the parameters and total effective distances for some turbo codes of rate 1/C constructed from two RSC codes of rate $1/C_1$ and $1/C_2$.

TABLE 1

| 1/C | (1/C$_1$, 1/C$_2$) | (1, g$_2$/h$_2$, ..., g$_C$/h$_C$) | (M$_1$, ..., M$_C$) | (d$_{1,ef}$, ..., d$_{C,ef}$) | d$_{t,ef}$ |
|---|---|---|---|---|---|
| 1/3 | (1/2, 1/2) | (1, 5/7, 5/7) | (2, 5, 5) | (2, 4, 4) | 44 |
| 1/4 | (1/2, 1/3) | (1, 5/7, 5/7, 3/7) | (2, 5, 3, 2) | (2, 4, 4, 2) | 40 |
| 1/5 | (1/3, 1/3) | (1, 5/7, 3/7, 5/7, 3/7) | (2, 3, 2, 3, 2) | (2, 4, 2, 4, 2) | 36 |

FIG. 6 shows the effect of the different kinds of parity check symbols by fixing the repetition number of the data symbols and changing the code rate and the repetition number of the parity check symbols. In addition, the parameters and the repetition vectors of the codes used for obtaining FIG. 6 are provided in Table 1 along with the corresponding total effective free distance.

While the rate 1/3 turbo code with the (2, 5, 5) repetition vector performs best in the error floor region, it shows the worst performance in the low SNR region. Note that the code fragment generated by the generator 3/7 has a smaller weight contribution to the effective free distance than that of the generator 5/7. Thus, as new code fragments generated by the generator 3/7 are added, the performance in the error floor region gets worse, while that in the low SNR region gets better. Therefore, the desired code rate and repetition method should be properly selected according to the operating BER values.

It is also investigated in the present invention the performance of the system when the multiple access interference (MAI) exists.

Figure 7:
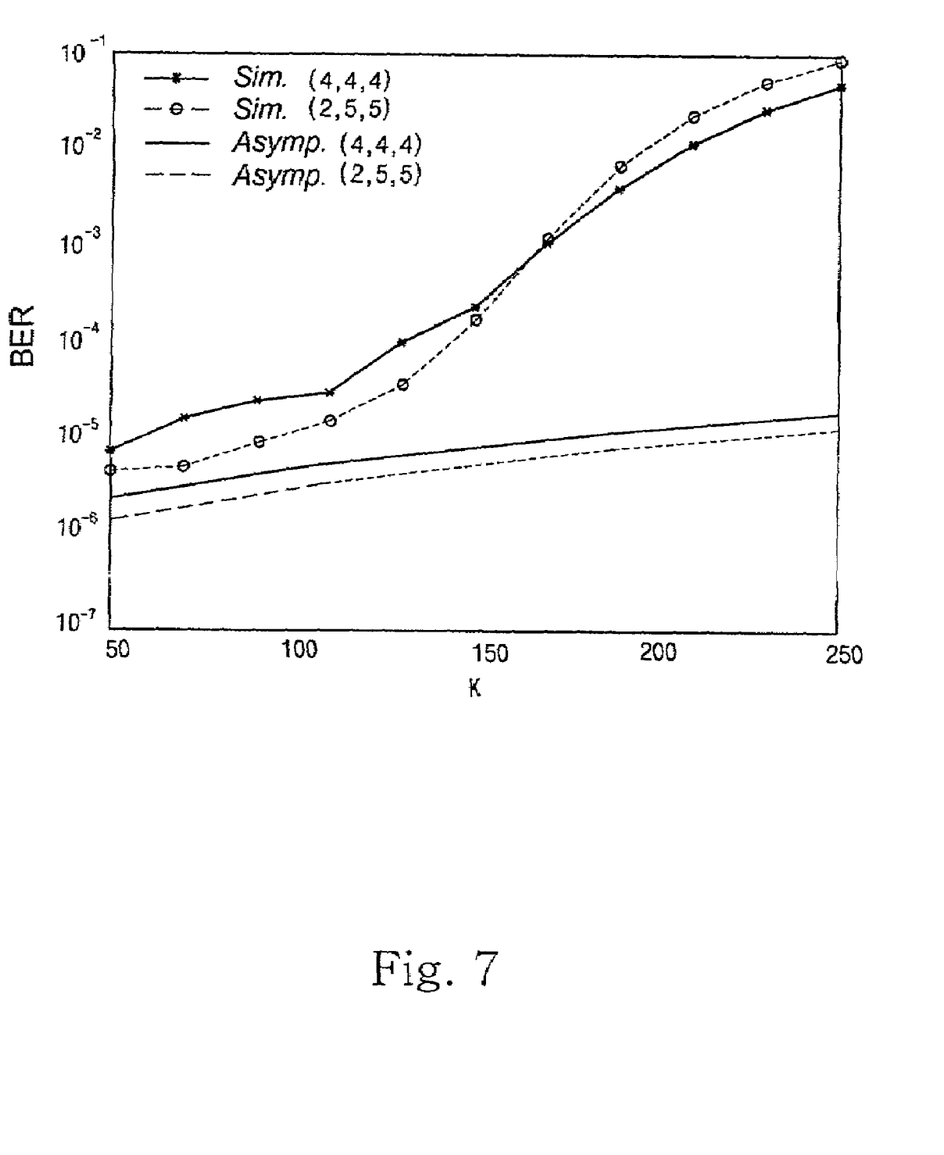
FIG. 7 is a graph showing the bit error rate along with K when M=12, W=1000, $E_b/\eta_0$=5 dB and a rate ⅓ turbo code is used.

FIG. 7 is a graph showing the bit error rate along with K when M=12, W=1000, E$_b$/η$_0$=5 dB and a rate 1/3 turbo code is used.

In the figure, it is observed that there is a crossover between the two repetition methods, which was also observed in the single user case.

That is, at the BER values below the crossover, the effective free distance dominates the performance characteristics so that the system with the (2, 5, 5) repetition vector performs better than that with the (4, 4, 4) repetition vector. On the other hand, the results are reversed at the BER values above the crossover, since increasing the diversity order to the parity check symbols leads to some divergence of the iterative decoding in the low SNR region.

Conclusively, by increasing the total effective free distance with a proper repetition method, the system capacity can be increased at the low BER region near or below the error floor region.

For example, at a BER of 10$^{-5}$, the system can admit about 40 users more with the (2, 5, 5) repetition vector than with the (4, 4, 4) repetition vector for a rate 1/3 turbo code.

As mentioned thereinbefore, a multicarrier DS/CDMA system in accordance with the present invention increases the diversity order to the parity check symbols when encoding/decoding the data bits in a turbo encoder/decoder so that it can provide a better communication quality under the mobile communication environment when being applied to a base station and a mobile terminal.

In addition, it can increase the number of possible users under the mobile communication environment by reducing the fading effect by increasing the diversity of the codes and the channels.

Since those having ordinary knowledge and skill in the art of the present invention will recognize additional modifications and applications within the scope thereof, the present invention is not limited to the embodiments and drawings described above.

What is claimed is:

1. A multicarrier direct sequence code division multiple access (DS/CDMA) system using a turbo code with non-uniform repetition coding comprising:

a turbo encoder for encoding input data bits;

a repeater/symbol mapper for replicating the turbo code symbols outputted from said turbo encoder into repetition code symbols in frequency domain and mapping said replicated repetition code symbol signals appropriately;

at least one first interleaver for changing channels for the turbo code symbols outputted from said repeater/symbol mapper so that the fading effect is properly distributed on the codeword symbols;

at least one first multiplier for multiplying a signature sequence to the turbo code symbols, which are properly rearranged by said at least one first interleaver, for band-broadening;

at least one impulse modulator for modulating the band-broadened signals from said at least one first multiplier to an impulse shape;

at least one chip wave-shaping filter for smoothening the waveform of the output signals from said at least one impulse modulator and eliminating the interference between the symbols;

at least one second multiplier for mapping the output signals from said at least one chip wave-shaping filter to each frequency band;

a first adder for adding all the output signals from said at least one second multiplier and transmitting the signals; and a reception system for receiving the transmitted signals from said first adder.

2. A multicarrier direct sequence code division multiple access (DS/CDMA) system using a turbo code with non-uniform repetition coding as claimed in claim 1, wherein said reception system comprises:

at least one chip matched filter for chip-matched filtering the signals transmitted from said first adder for each channel;

at least one third multiplier for the chip-matched filtered signals for each channel outputted from said at least one chip-matched filter transmitting through;

at least one lowpass filter for inphase modulating and lowpass filtering the signals transmitted through said at least one third multiplier;

at least one correlator for sampling the lowpass filtered signals outputted from said at least one low-pass filter at each T$_c$ and thereafter correlating the signal with a signature sequence of a user;

at least one second interleaver for rearranging the sequence of the signals, correlated with a signature sequence of a desired user, outputted from said at least one correlator back to the original sequence by deinterleaving;

a symbol demapper for demapping the separated symbol signals outputted from said at least one second interleaver; and a turbo decoder for decoding the demapped symbol signals outputted from said symbol demapper.

3. A multicarrier direct sequence code division multiple access (DS/CDMA) system using a turbo code with non-uniform repetition coding as claimed in claim 1, wherein said turbo encoder comprises:

an interleaver;

a first recursive systematic convolutional (RSC) encoder for encoding input turbo code symbols into parity check symbols; and a second recursive systematic convolutional (RSC) encoder for encoding the turbo code symbols properly rearranged by said interleaver into parity check symbols, and thereby characterize by performing a repetition coding with giving an additional diversity order to the turbo code symbols.

4. A multicarrier direct sequence code division multiple access (DS/CDMA) system using a turbo code with non-uniform repetition coding as claimed in claim 1, wherein said impulse modulators are constructed from in-phase modulators.

5. A multicarrier direct sequence code division multiple access (DS/CDMA) system using a turbo code with non-uniform repetition coding as claimed in claim 2, characterized in that said turbo decoder decodes the turbo code symbols by using a turbo decoding metric of an iterative process based on a branch transition metric and a log-likelihood ratio (LLR) using the following equations of Equations 31 and 32:

$$p(z_l^1, \{z_l^j\}_{p_1} | b_l = i, S_{l-1}, S_l, \alpha) = \qquad \text{[Equation 31]}$$

$$p(z_l^1 | b_l = i, S_{l-1}, S_l, \alpha) p(\{z_l^j\}_{p_1} | b_l = i, S_{l-1}, S_l, \alpha) =$$

$$\prod_{q \in A_1} \frac{1}{\sqrt{2\pi\sigma_q^2}} \exp\left\{-\frac{(z_{q,l} - \alpha_{q,l} x_{1,l}(i))^2}{2\sigma_q^2}\right\} \times$$

$$\prod_{j=2}^{C_1} \prod_{q \in A_j} \frac{1}{\sqrt{2\pi\sigma_q^2}} \exp\left\{-\frac{(z_{q,l} - \alpha_{q,l} x_{j,l}(i, S_{l-1}, S_l))^2}{2\sigma_q^2}\right\} =$$

$$B_l \exp\left\{\left(\sum_{q \in A_1} \frac{\alpha_{q,l} z_{q,l}}{\sigma_q^2}\right) x_{1,l}(i) + \sum_{j=2}^{C_1} \left(\sum_{q \in A_j} \frac{\alpha_{q,l} z_{q,l}}{\sigma_q^2}\right) x_{j,l}(i, S_{l-1}, S_l)\right\},$$

where, $x_{1,l}(i) = \pm 1$ according to $b_l = i$;

$x_{J,l}(i, S_{l-1}, S_l) = \pm 1$ according to the value of the j-th code symbol generated when the state transits from $S_{l-1}$ to $S_l$ with input, $b_l = i$; and $B_l$: a constant which has no influence on the decoding process, $$L_k(\hat{b}_l) = \log\frac{Pr\{b_l = 1 | \text{observation}\}}{Pr\{b_l = 0 | \text{observation}\}} = \qquad \text{[Equation 32]}$$

$$\log\frac{\sum_{S_l}\sum_{S_{l-1}} \gamma_1((z_l^1, \{z_l^j\}_{P_k}), S_{l-1}, S_l | \alpha) \varepsilon_{l-1}(S_{l-1}) \beta_l(S_l)}{\sum_{S_l}\sum_{S_{l-1}} \gamma_0((z_l^1, \{z_l^j\}_{P_k}), S_{l-1}, S_l | \alpha) \varepsilon_{l-1}(S_{l-1}) \beta_l(S_l)},$$

where, $L_k(\bullet)$: LLR computed by the decoder k(=1, 2), $\varepsilon_l(\bullet)$: forward recursion, and $\beta_l(\bullet)$: backward recursion.

\* \* \* \* \*